(12) United States Patent
Shih

(10) Patent No.: US 9,921,492 B2
(45) Date of Patent: Mar. 20, 2018

(54) FIXTURE FOR A PHOTOSENSITIVE SEAL MACHINE

(71) Applicant: SUN SAME ENTERPRISES CO., LTD., Tainan (TW)

(72) Inventor: Wen-Jer Shih, Tainan (TW)

(73) Assignee: SUN SAME ENTERPRISES CO., LTD., Tainan (TW)

( * ) Notice: Subject to any disclaimer, the term of this patent is extended or adjusted under 35 U.S.C. 154(b) by 102 days.

(21) Appl. No.: 15/055,946

(22) Filed: Feb. 29, 2016

(65) Prior Publication Data

US 2017/0212430 A1 Jul. 27, 2017

(30) Foreign Application Priority Data

Jan. 26, 2016 (TW) .............................. 105201176 U

(51) Int. Cl.
*B41N 6/00* (2006.01)
*G03F 7/20* (2006.01)

(52) U.S. Cl.
CPC ................ *G03F 7/70733* (2013.01)

(58) Field of Classification Search
CPC .................................................. G03F 7/70733
USPC ...................................................... 101/401.1
See application file for complete search history.

(56) References Cited

U.S. PATENT DOCUMENTS

| | | | | |
|---|---|---|---|---|
| 3,719,141 A | * | 3/1973 | Jaffa | B41F 15/0813 101/126 |
| 4,814,830 A | * | 3/1989 | Isohata | G03F 7/20 355/53 |
| 5,799,586 A | * | 9/1998 | Teixidor Casanovas | B65D 19/0028 108/51.3 |
| 5,959,964 A | * | 9/1999 | Bydalek | G11B 33/0422 206/307.1 |
| 6,061,983 A | * | 5/2000 | McCleskey | H02G 3/185 52/220.1 |
| 7,462,094 B2 | * | 12/2008 | Yoshida | B24B 1/00 451/287 |
| 2005/0105073 A1 | * | 5/2005 | Stacker | G03F 7/70466 355/53 |
| 2006/0092399 A1 | * | 5/2006 | Ockwell | G03F 7/70733 355/72 |
| 2011/0123913 A1 | * | 5/2011 | Yoshimoto | G03F 7/707 430/30 |
| 2013/0314685 A1 | * | 11/2013 | Shin | G03F 7/70733 355/72 |

* cited by examiner

*Primary Examiner* — Anthony Nguyen
(74) *Attorney, Agent, or Firm* — Fishman & Associates, LLC.

(57) ABSTRACT

A fixture for a photosensitive seal machine is deposited on a transfer paper on the photosensitive seal machine to locate at least one stamp, and the fixture has a frame. The frame has a top surface, a bottom surface, multiple locating recesses and multiple retaining faces. The bottom surface is opposite to the top surface. The locating recesses are formed through the top surface of the frame. The retaining faces are formed in the frame and respectively surround the locating recesses of the frame. Each stamp is located well by the fixture to increase the exposure effect of the stamps and raise the yield rate of the stamps.

2 Claims, 14 Drawing Sheets

FIXTURE FOR A PHOTOSENSITIVE SEAL MACHINE

BACKGROUND OF THE INVENTION

1. Field of the Invention

The present invention relates to a fixture, and more particularly to a fixture that is mounted on a photosensitive seal machine to provide a locating effect to stamps and may improve the exposure effect of the photosensitive seal machine.

2. Description of Related Art

With reference to FIGS. 13 and 14, stamps 90 may be put on a photosensitive seal machine 80 to form patterns or characters on printing faces 91 of the stamps 90. The photosensitive seal machine 80 has a seat 81, an exposure apparatus 82, and a cover 83. The seat 81 has a chamber 84 and an opening 85. The chamber 84 is formed in the seat 81. The opening 85 is formed through a top surface of the seat 81 and is in communication with the chamber 84. A plate 86 is translucent, is mounted on the top surface of the seat 81, and covers the opening 85. The exposure apparatus 82 is mounted in the chamber 84 of the seat 81. The cover 83 is pivotally mounted on and covers the seat 81.

A transfer paper 70 is put on the plate 86. The transfer paper 70 has multiple exposed areas 71 and multiple dotted lines 72. The exposed areas 71 are formed on the transfer paper 70 at spaced intervals. The dotted lines 72 are formed on the transfer paper 70 and respectively surround the exposed areas 71. The printing face 91 of each stamp 90 is deposited on a respective one of the exposed areas 71 of the transfer paper 70 mounted on the plate 86. After an outer edge of each stamp 90 aligns with the dotted line 72 that surrounds the corresponding exposed areas 71, the cover 83 may be covered on the seat 81 to perform an exposure operation of each stamp 90 on the seat 81.

However, each stamp 90 may not be located well to deposit on the transfer paper 70. Upon shock or while the cover 83 is covering the seat 81, each stamp 90 deposited on the transfer paper 70 is easy to deviate from a corresponding dotted line 72. The printing face 91 of each stamp 90 is easy to move out of the corresponding exposed area 71 of the transfer paper 70. Therefore, the exposure effect of the stamp 90 is bad.

To overcome the shortcomings, the present invention tends to provide a fixture to mitigate or obviate the aforementioned problems.

SUMMARY OF THE INVENTION

The main objective of the invention is to provide a fixture that may locate the stamps for improving the exposure effect.

The fixture for a photosensitive seal machine is deposited on a transfer paper on the photosensitive seal machine to locate at least one stamp, and the fixture has a frame. The frame has a top surface, a bottom surface, multiple locating recesses and multiple retaining faces. The bottom surface is opposite to the top surface. The locating recesses are formed through the top surface of the frame and the bottom surface of the frame at spaced intervals. The retaining faces are formed in the frame and respectively surround the locating recesses of the frame.

The transfer paper is deposited on the photosensitive seal machine. The fixture is deposited on the transfer paper. The transfer paper on the photosensitive seal machine is pressed by the frame of the fixture. The locating recesses of the frame respectively align with the exposed areas formed on the transfer paper. The stamps are respectively deposited into the locating recesses of the frame and are respectively retained by the retaining faces of the frame. The stamps cannot move out of the frame. A printing face of each stamp aligns with a corresponding exposed area on the transfer paper. Therefore, each stamp is located well by the fixture and cannot deviate from a corresponding dotted line. The locating effect of the fixture is good to increase the exposure effect of the stamps and the yield rate of the stamps.

DETAILED DESCRIPTION OF PREFERRED EMBODIMENT

Figure 1:
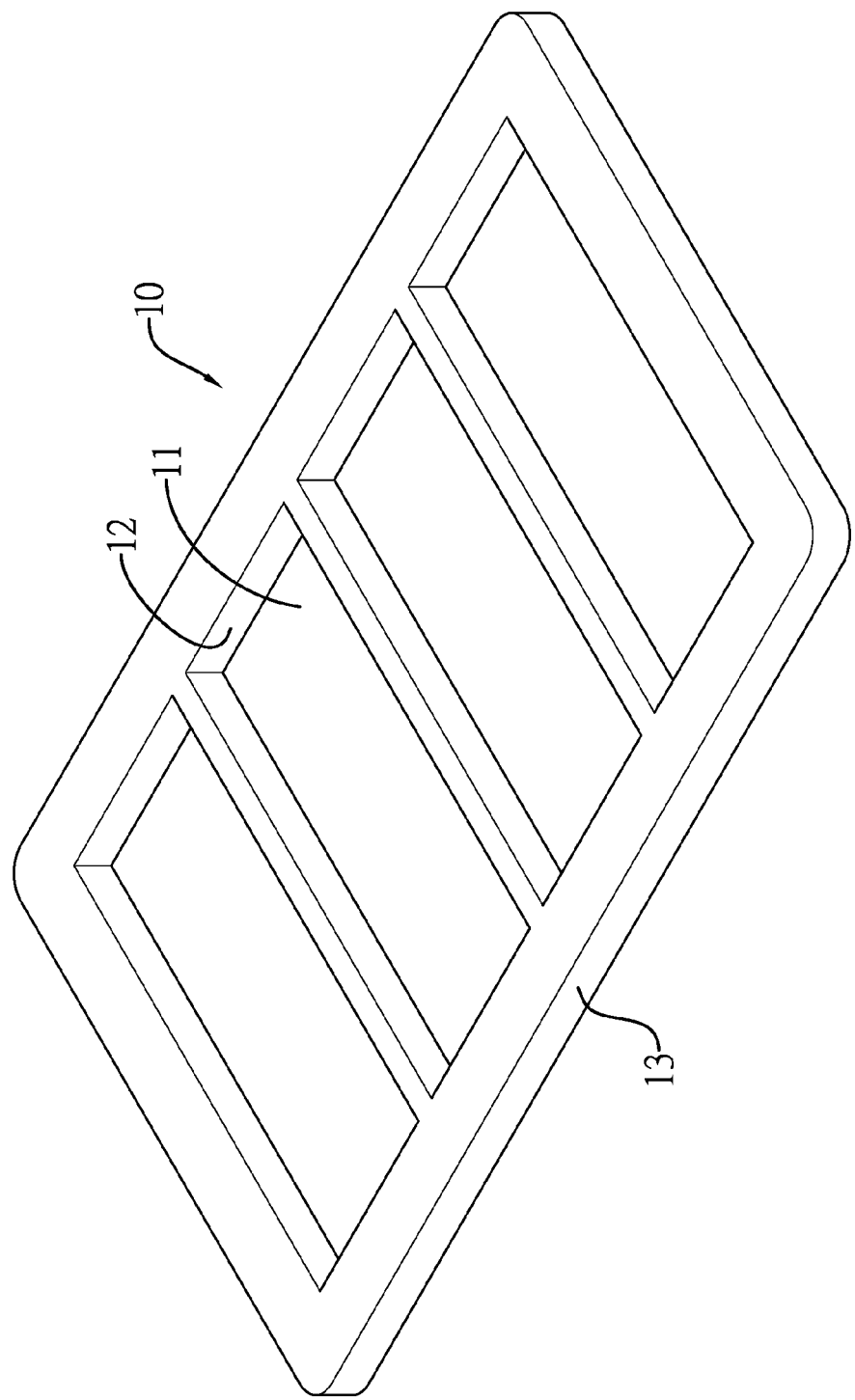
FIG. 1 is a perspective view of a first embodiment of a fixture for a photosensitive seal machine in accordance with the present invention.
Figure 2:
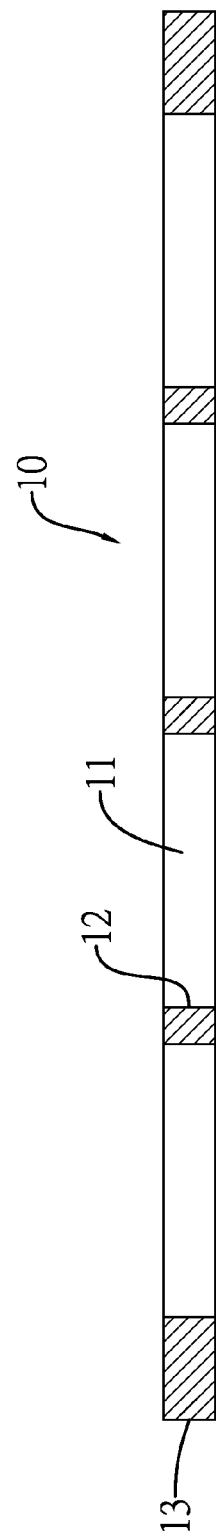
FIG. 2 is a cross-sectional side view of the fixture in FIG. 1.

With reference to FIGS. 1 and 2, a first embodiment of a fixture for a photosensitive seal machine in accordance with the present invention comprises a frame 10. The frame 10 has a top surface, a bottom surface, multiple locating recesses 11, and multiple retaining faces 12. The bottom surface of the frame 10 is opposite to the top surface of the frame 10. The locating recesses 11 are formed through the top surface and the bottom surface of the frame 10 at spaced intervals. The retaining faces 12 are formed in the frame 10 and respectively surround the locating recesses 11 of the frame 10. Furthermore, the fixture has an auxiliary locating face 13. The auxiliary locating face 13 is formed around an outer surface of the frame 10. In the first embodiment of the fixture, the frame 10 is rectangular in shape. The locating recesses 11 are rectangular in shape.

Figure 3:
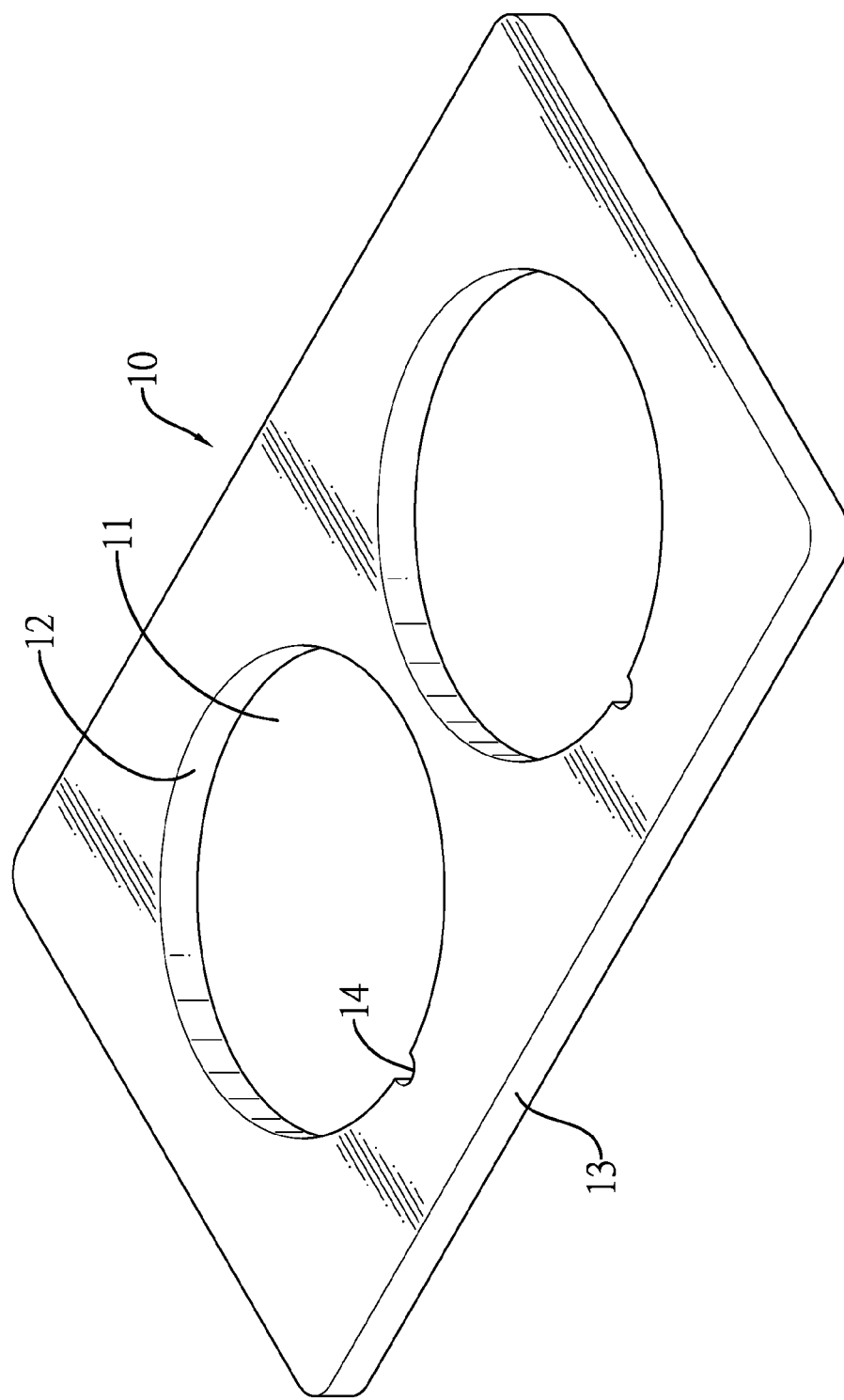
FIG. 3 is a perspective view of a second embodiment of a fixture for a photosensitive seal machine in accordance with the present invention.

With reference to FIG. 3, in a second embodiment of the fixture in accordance with the present invention, the frame 10 is rectangular in shape. The locating recesses 11 are circular in shape. Furthermore, the fixture has multiple locating notches 14. The locating notches 14 are respectively formed in the retaining faces 12 and are respectively in communication with the locating recesses 11. Stamps (not shown) having circular outer surfaces may be deposited to the locating recesses 11, which are circular. Each one of the circular outer surfaces of the stamps has a retaining protrusion. The retaining protrusion is inserted into a corresponding locating notch 14 of one of the locating recesses 11 of the frame 10 for preventing rotation of the stamp having the circular outer surface. Therefore, the stamp having the circular outer surface is retained securely.

Figure 4:
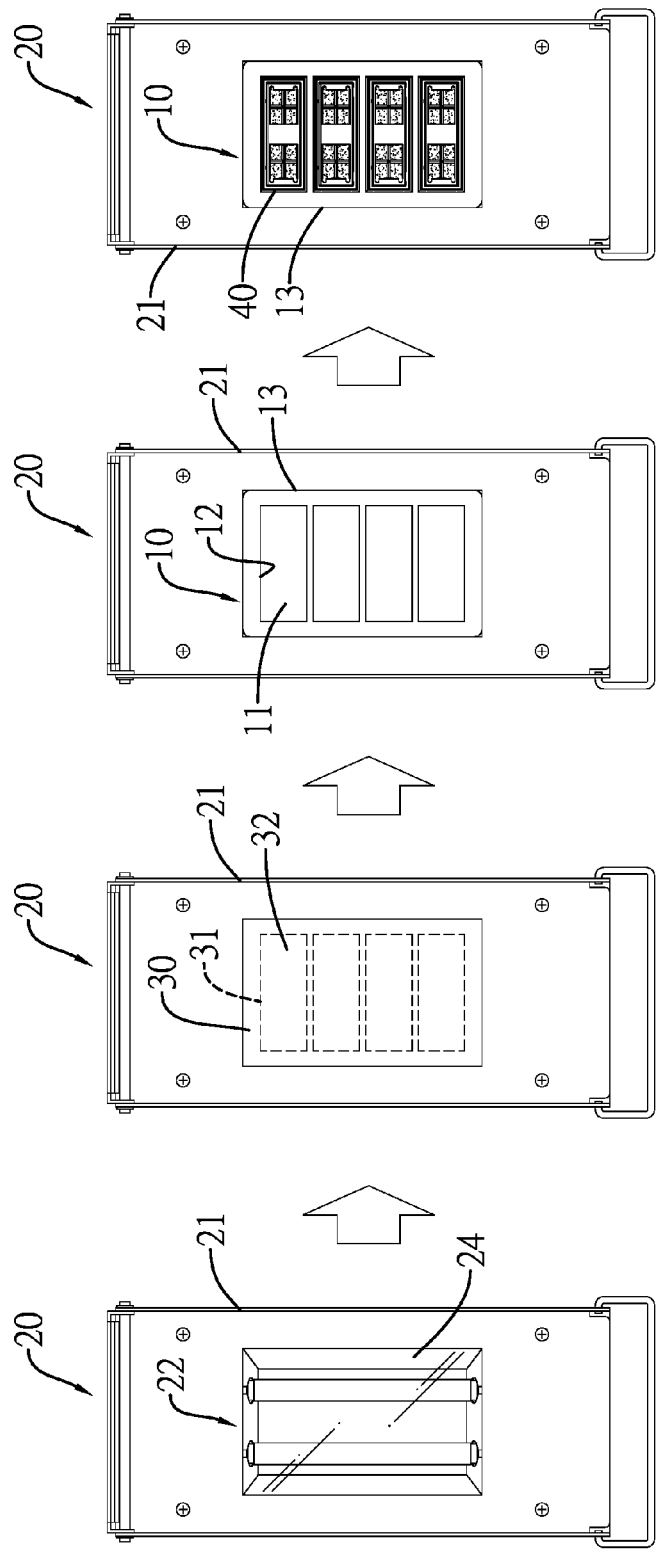
FIG. 4 is an operational top view of the fixture in FIG. 1 with the photosensitive seal machine, a transfer paper, and multiple stamps.
Figure 9:
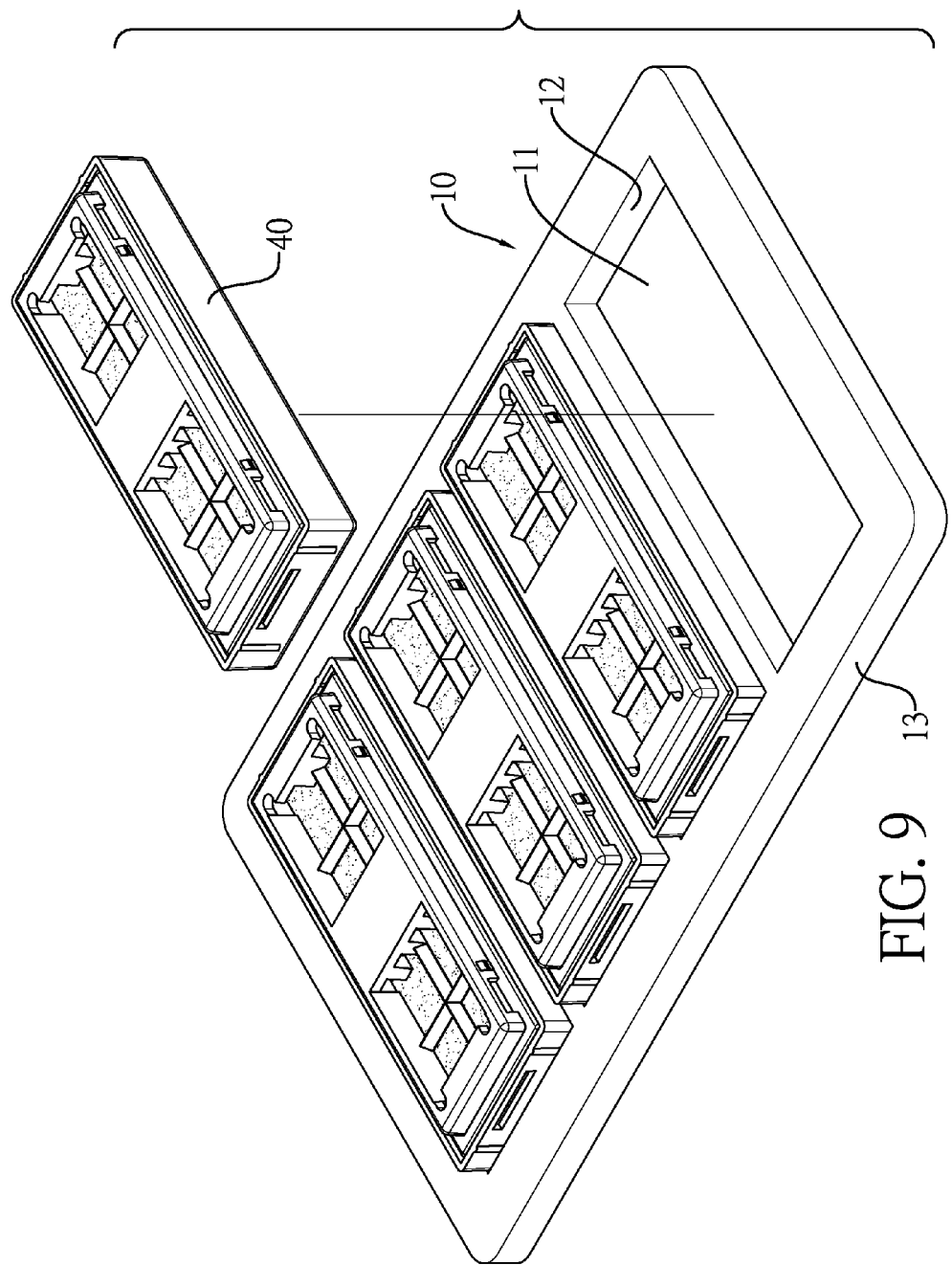
FIG. 9 is an exploded perspective view of the fixture in FIG. 1 for positioning the stamps.
Figure 10:
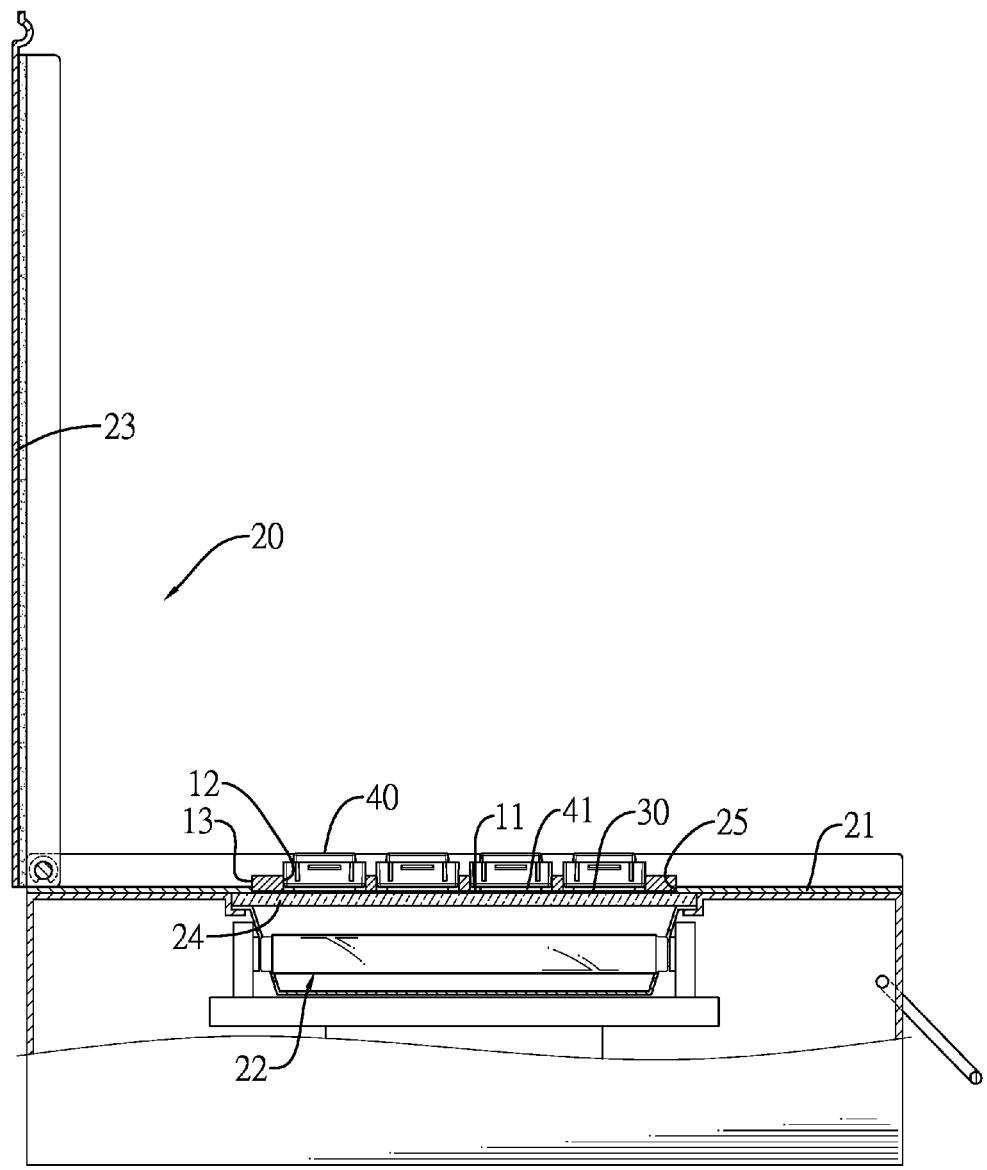
FIG. 10 is a side view in partial section of the fixture in FIG. 1, deposited on the photosensitive seal machine and not covered by a cover of the photosensitive seal machine.

With reference to FIGS. 4, 9, and 10, in an exposure progress of the stamps 40, a transfer paper 30 is deposited on the photosensitive seal machine 20 and the fixture is deposited on the transfer paper 30 to locate at least one of the stamps 40.

Figure 5:
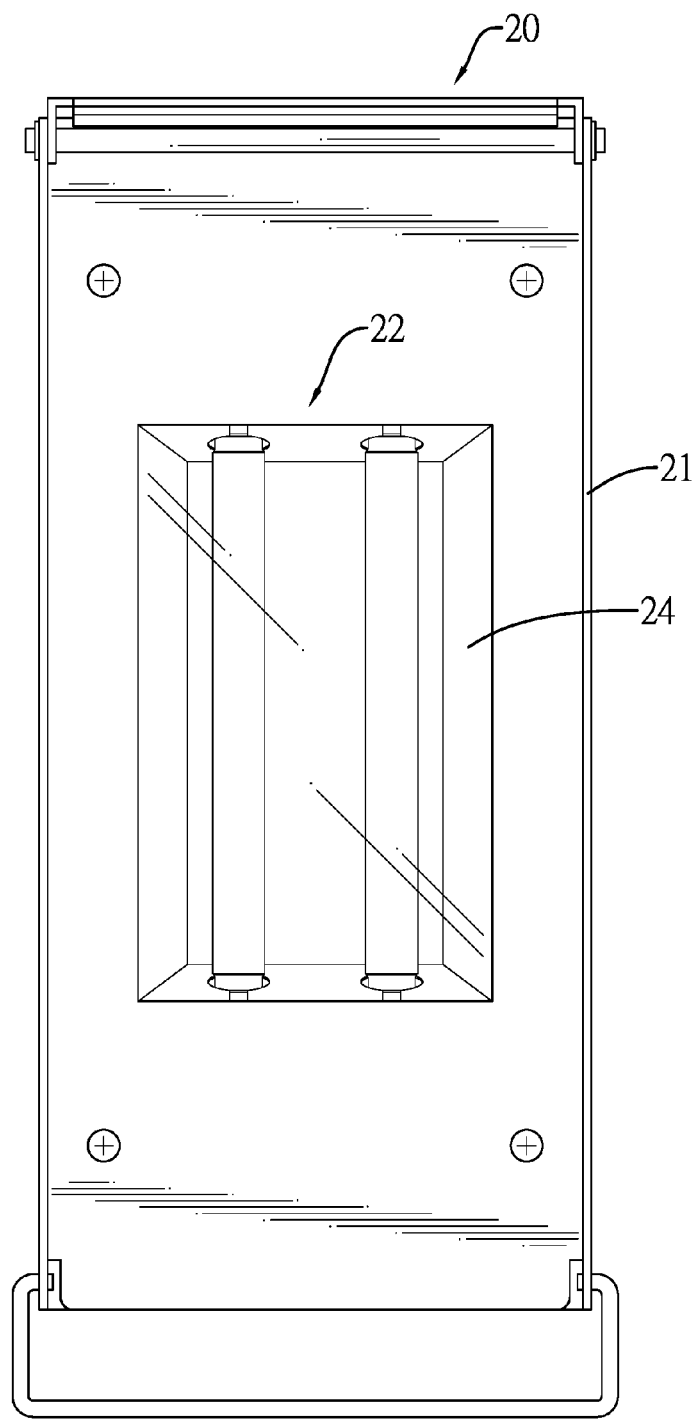
FIG. 5 is an enlarged top view of the photosensitive seal machine in FIG. 4.

With reference to FIGS. 5 and 10, the photosensitive seal machine 20 has a seat 21, a plate 24, an exposure apparatus 22, and a cover 23. The plate 24 is translucent and is mounted on a top surface of the seat 21. The exposure apparatus 22 is mounted in the seat 21 below the plate 24. The cover 23 is pivotally connected to and covers the seat 21.

Figure 6:
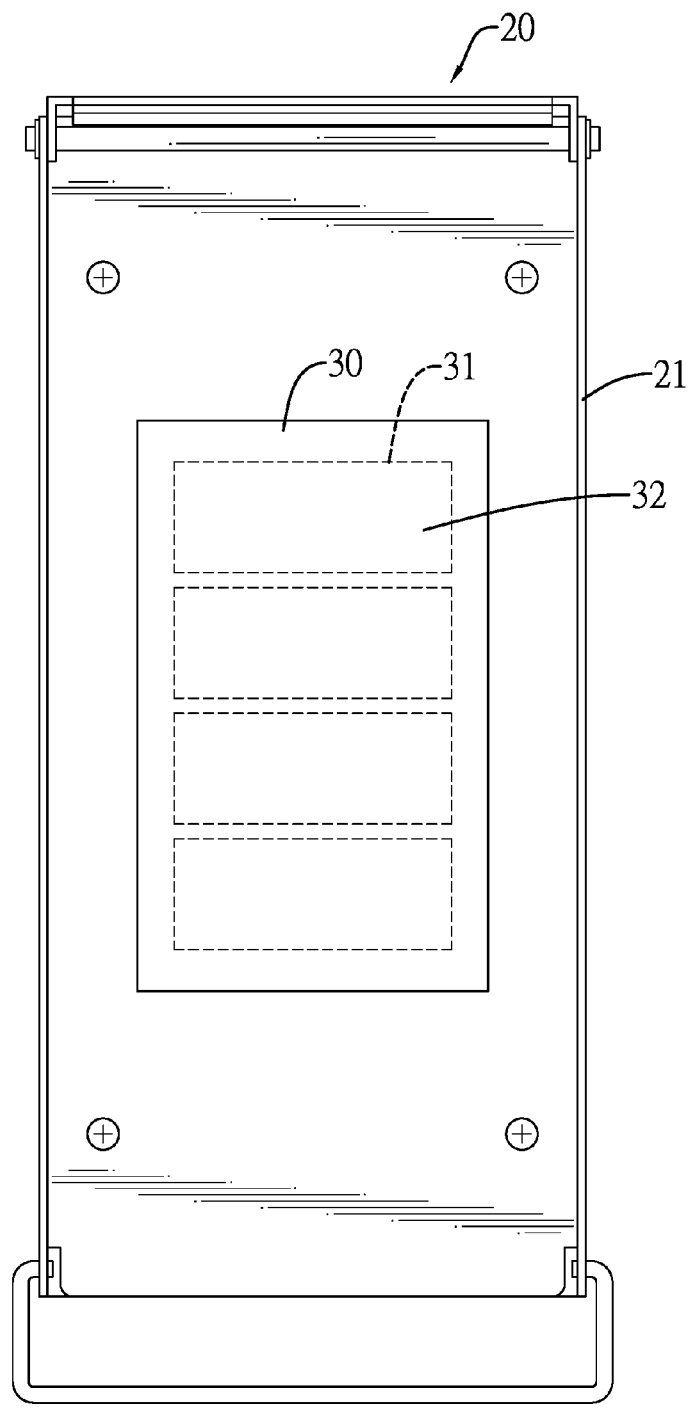
FIG. 6 is an operational top view of the transfer paper in FIG. 4, mounted on the photosensitive seal machine.

With reference to FIG. 6, the transfer paper 30 is put on the plate 24 that is mounted on the seat 21. The transfer paper 30 has multiple exposed areas 32 and multiple dotted lines 31. The exposed areas 32 are formed on the transfer paper 30 at spaced intervals and have patterns or characters formed on the exposed areas 32. The dotted lines 31 are formed on the transfer paper 30 and respectively surround the exposed areas 32.

Figure 7:
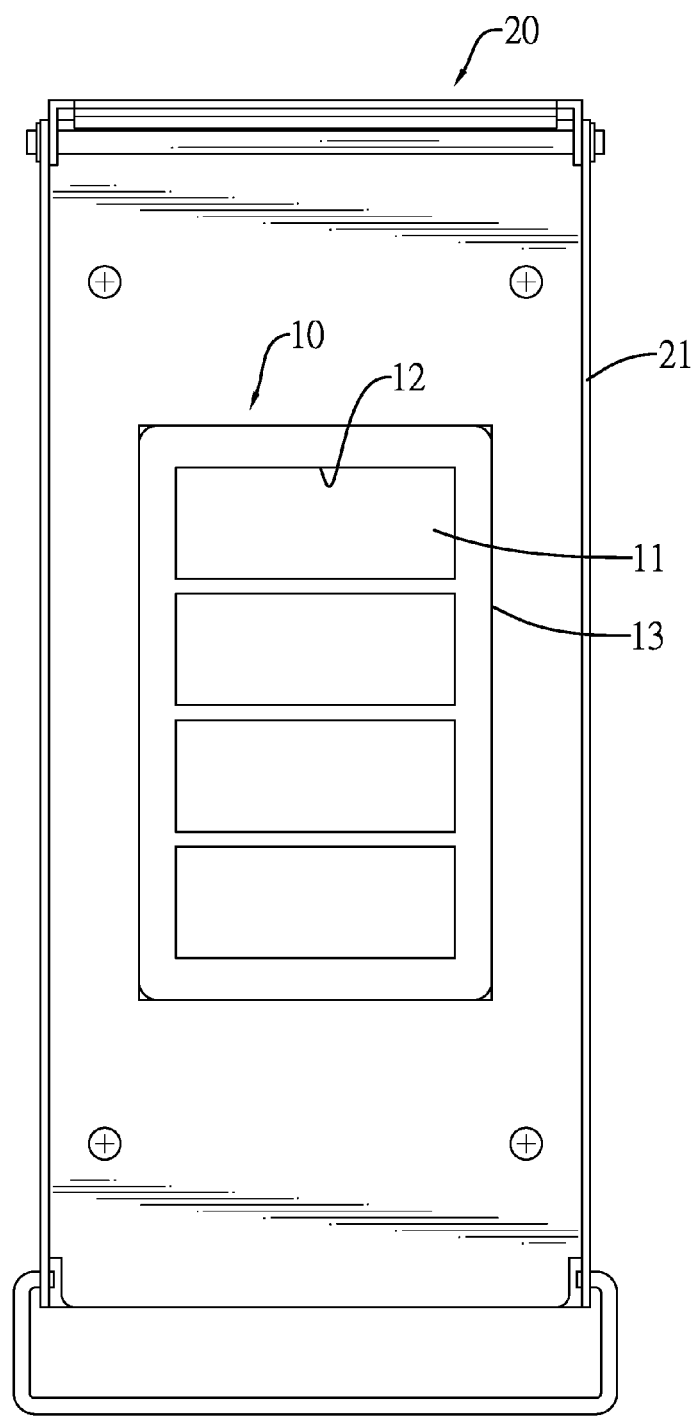
FIG. 7 is an operational top view of the fixture in FIG. 1, mounted on the transfer paper.

With reference to FIG. 7, the frame 10 is deposited on a top surface of the transfer paper 30. The locating recesses 11 of the frame 10 are respectively corresponding to the exposed areas 32 of the transfer paper 30 in shape. The outer edges of the locating recesses 11 respectively align with the dotted lines 31 surrounding the exposed areas 32.

Figure 8:
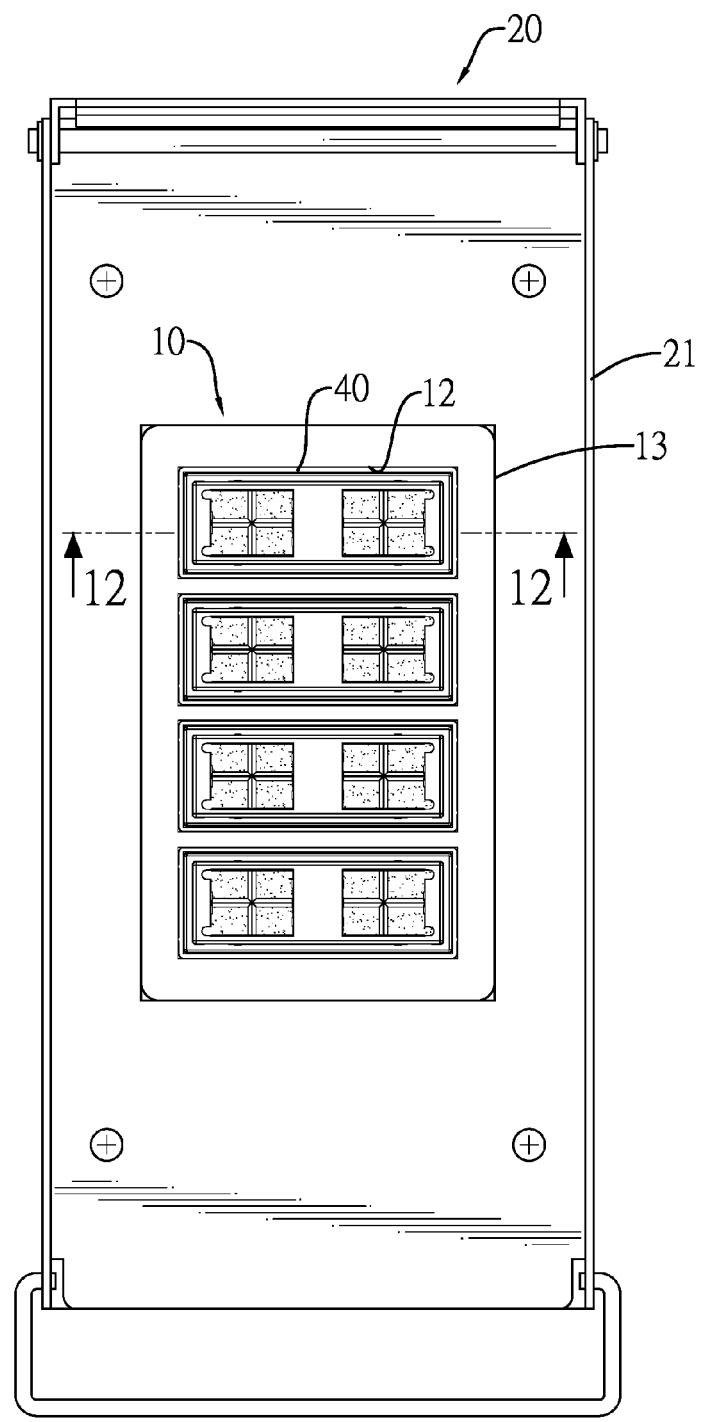
FIG. 8 is an operational top view of the stamps in FIG. 4, deposited on the fixture.

With reference to FIGS. 8 to 10, the stamps 40 are respectively deposited into the locating recesses 11 of the frame 10. The printing faces 41 of the stamps 40 respectively contact the exposed areas 32 of the transfer paper 30. The outer surfaces of the stamps 40 are respectively retained by the retaining faces 12 of the frame 10. The stamps 40 may be positioned securely in the frame 10. Upon shock or vibration or when the cover 23 is covering the seat, the printing faces 41 of the stamps 40 may still contact the exposed areas 32 of the transfer paper 30. The printing faces 41 of the stamps 40 are hard to deviate from the exposed areas 32 of the transfer paper 30.

Figure 11:
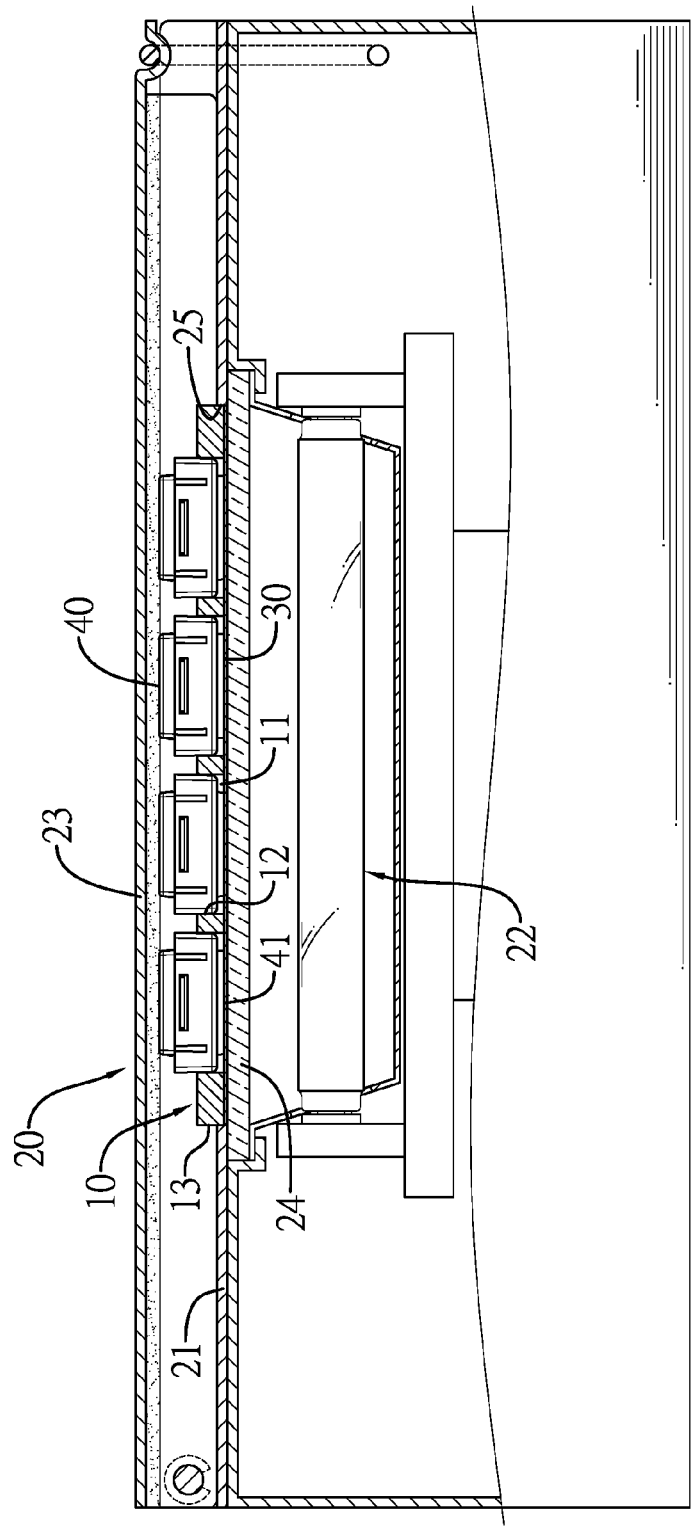
FIG. 11 is a side view in partial section of the fixture in FIG. 1, deposited on the photosensitive seal machine and covered by the cover of the photosensitive seal machine.

With reference to FIG. 11, when the cover 23 covers the seat, the printing faces 41 of the stamps 40 are exposed by the exposure apparatus 22 of the photosensitive seal machine 20. The patterns or the characters shown on the exposed areas 32 of the transfer paper 30 are transfer printed on the printing faces 41 of the stamps 40.

Figure 12:
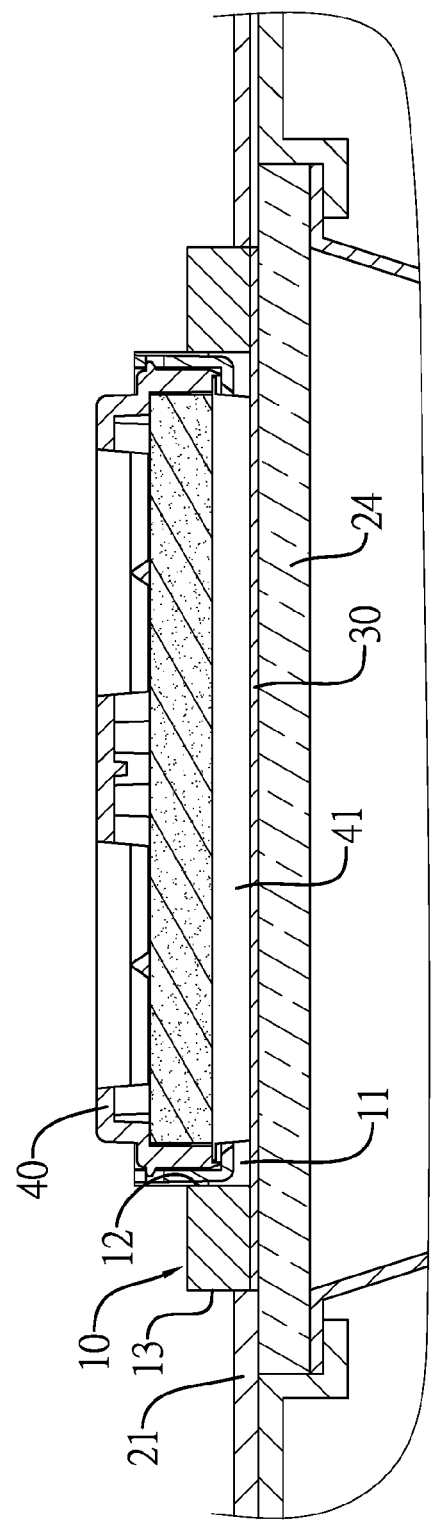
FIG. 12 is an enlarged rear side view in partial section of the fixture along line 12-12 in FIG. 8.
Figure 13:
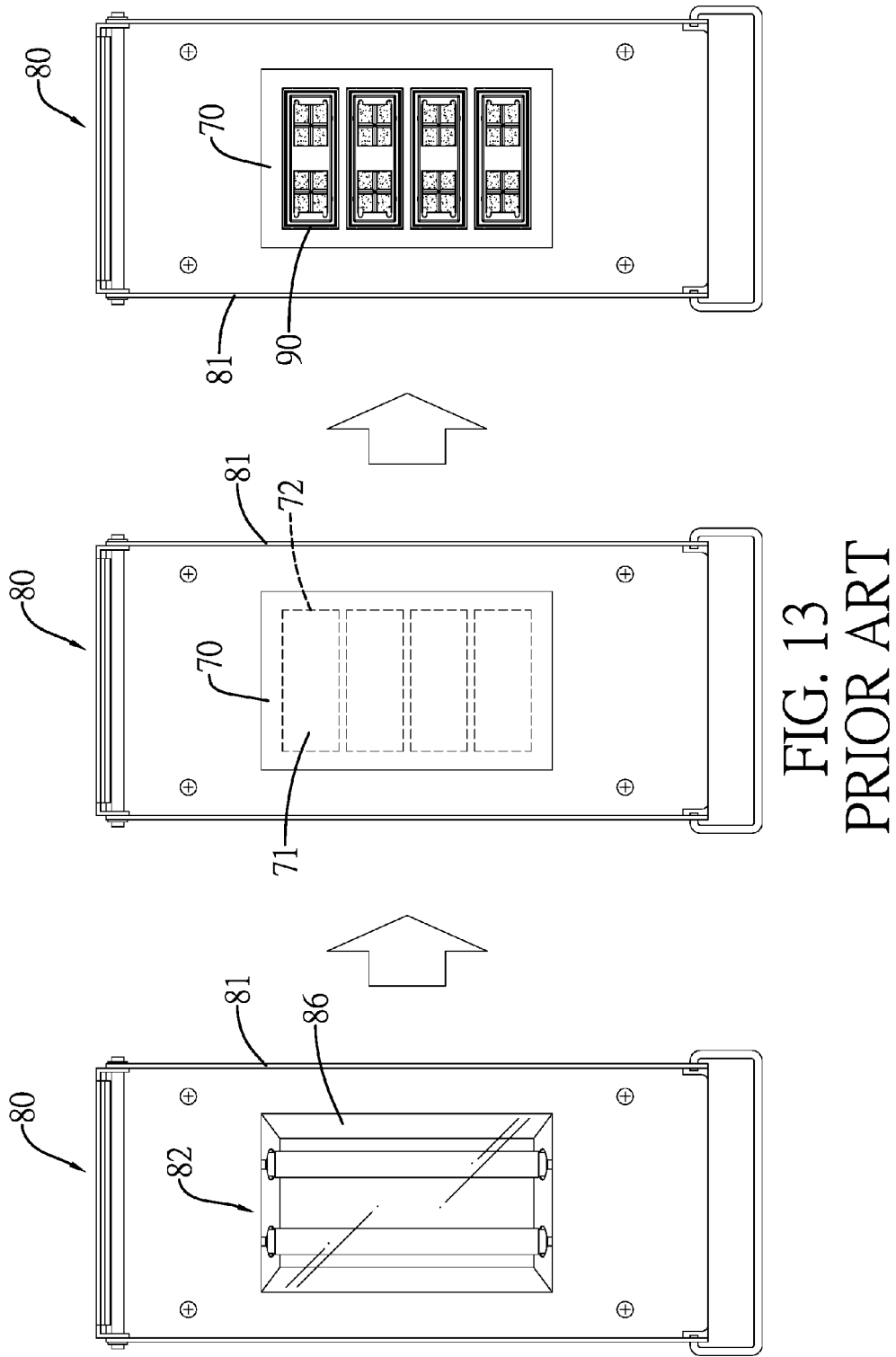
FIG. 13 is an operational top view of a photosensitive seal machine, multiple conventional stamps, and a conventional transfer paper in accordance with the prior art.
Figure 14:
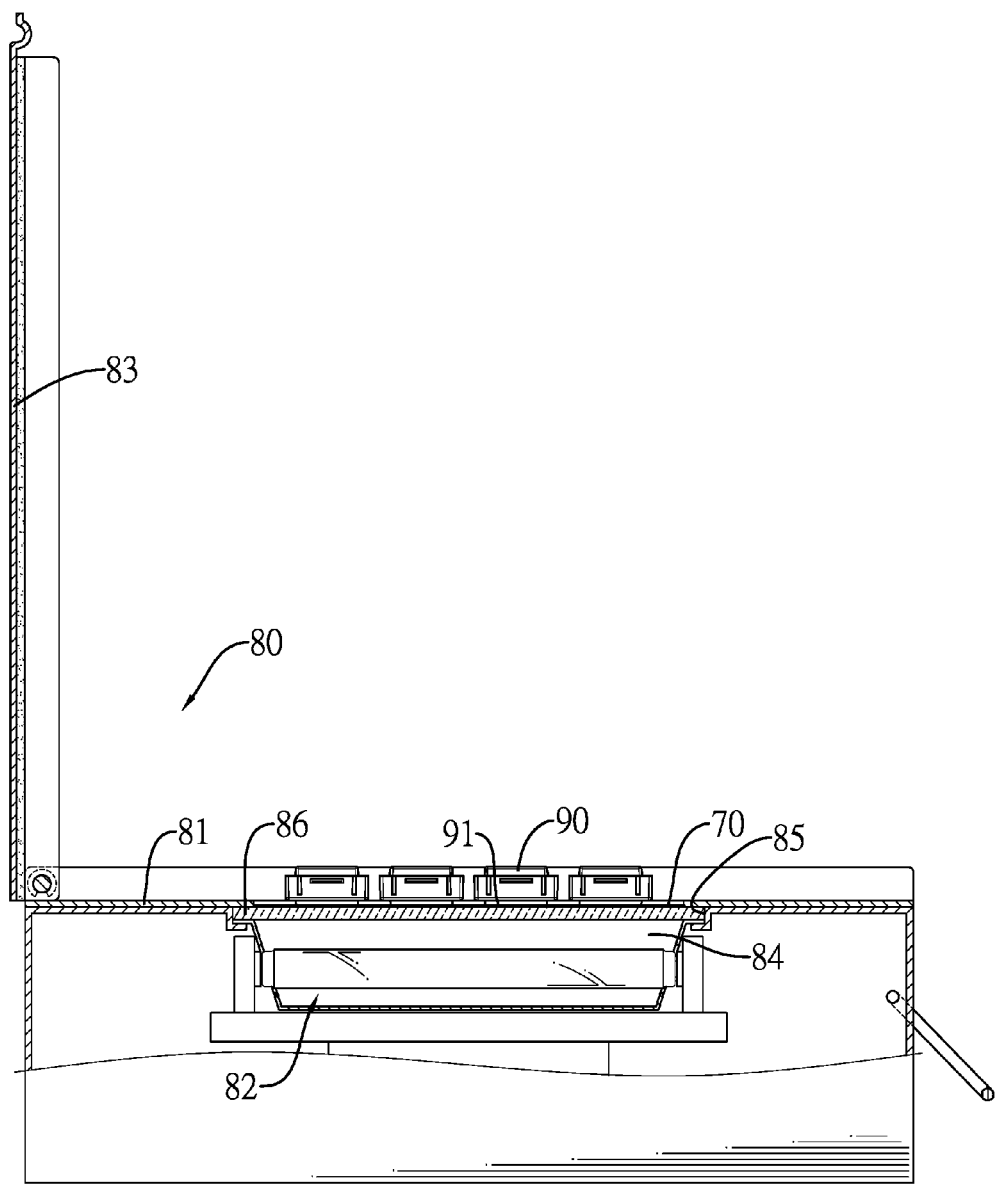
FIG. 14 is a side view in partial section of the photosensitive seal machine, multiple conventional stamps, and a conventional transfer paper in FIG. 13.

With reference to FIGS. 11 and 12, the seat 21 further has a wall 25. The wall 25 is formed on the top surface of the seat 21 above the plate 24. When the frame 10 is mounted on the transfer paper 30, the wall 25 surrounds the auxiliary locating face 13 of the frame 10 for retaining the frame 10.

Accordingly, the fixture may be deposited on the transfer paper 30. The locating recesses 11 of the fixture respectively align with the exposed areas 32 of the transfer paper 30, and then the stamps 40 are further deposited into the locating recesses 11 of the frame 10. The printing faces 41 of the stamps 40 align with the exposed areas 32 of the transfer paper 30 and would not move out of the exposed areas 32 of the transfer paper 30. The adjustment time of positioning each one of the stamps 40 is decreased. After each one of the stamps 40 is aligned with the locating recess 11 of the frame 10, the printing face 41 of each one of the stamps 40 is hard to deviate. Therefore, the locating effect of the fixture is good to increase the exposure effect of the stamps 40 and raise the yield rate of the stamps 40.

For producing a certain mass quantity of the stamps, the times of exposure of the photosensitive seal machine 20 are decreased since the yield rate of the stamps 40 is increased. In addition, within certain times of exposure of the photosensitive seal machine 20, the production quantity of the exposed stamps is increased since the yield rate of the stamps 40 is raised. The fixture for a photosensitive seal machine 20 has an advantage of improving the working efficiency.

What is claimed is:

1. A fixture for a photosensitive seal machine deposited on a transfer paper on the photosensitive seal machine to locate at least one stamp, and the fixture comprising:
    a frame being rectangular and having
        a top surface;
        a bottom surface opposite to the top surface of the frame;
        multiple locating recesses being circular, formed through the top surface, and the bottom surface of the frame at spaced intervals;
    multiple retaining faces formed in the frame and respectively surrounding the locating recesses of the frame; and
    multiple locating notches respectively formed in the retaining faces and respectively in communication with the locating recesses.

2. The fixture as claimed in claim 1, wherein the fixture has an auxiliary locating face formed around an outer surface of the frame.

* * * * *